(12) United States Patent
Qu et al.

(10) Patent No.: US 12,068,291 B2
(45) Date of Patent: Aug. 20, 2024

(54) DISPLAY PANEL, SPLICING DISPLAY PANEL AND PREPARATION METHOD THEREOF

(71) Applicants: Beijing BOE Display Technology Co., Ltd., Beijing (CN); BOE Technology Group Co., Ltd., Beijing (CN)

(72) Inventors: Lianjie Qu, Beijing (CN); Hong Yang, Beijing (CN); Hebin Zhao, Beijing (CN); Yun Qiu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 918 days.

(21) Appl. No.: 16/978,810

(22) PCT Filed: Nov. 15, 2019

(86) PCT No.: PCT/CN2019/118919
§ 371 (c)(1),
(2) Date: Sep. 8, 2020

(87) PCT Pub. No.: WO2021/092936
PCT Pub. Date: May 20, 2021

(65) Prior Publication Data
US 2023/0095298 A1 Mar. 30, 2023

(51) Int. Cl.
*H01L 25/075* (2006.01)
*G09F 9/302* (2006.01)
(Continued)

(52) U.S. Cl.
CPC ........ *H01L 25/0753* (2013.01); *G09F 9/3026* (2013.01); *G09F 9/33* (2013.01);
(Continued)

(58) Field of Classification Search
CPC . H01L 25/0753; H01L 27/156; H01L 33/005; G09F 9/3026; G09F 9/33
See application file for complete search history.

(56) References Cited

U.S. PATENT DOCUMENTS

2016/0372489 A1* 12/2016 Li ................... H01L 21/76802
2017/0373122 A1  12/2017 Chen
(Continued)

FOREIGN PATENT DOCUMENTS

CN   106097900 A   11/2016
CN   207765078 U    8/2018
(Continued)

*Primary Examiner* — Ratisha Mehta
(74) *Attorney, Agent, or Firm* — ArentFox Schiff LLP; Michael Fainberg

(57) ABSTRACT

The display panel includes a base substrate; and display areas arranged on the base substrate; each of the display areas includes pixel units; each of the pixel units includes sub-pixels; each of the sub-pixels includes a light-emitting chip; in any one of the display areas, a space between two adjacent columns of pixel units in a row direction has a first space size; and a space between two adjacent rows of pixel units in a column direction has a second space size; a space between two nearest display areas in the row direction has a third space size, and the third space size is approximately same as the first space size; and/or a space between two nearest display areas in the column direction has a fourth space size, and the fourth space size is approximately same as the second space size.

19 Claims, 12 Drawing Sheets

(51) Int. Cl.
*G09F 9/33* (2006.01)
*H01L 27/15* (2006.01)
*H01L 33/00* (2010.01)
*H01L 33/62* (2010.01)

(52) U.S. Cl.
CPC .......... *H01L 27/156* (2013.01); *H01L 33/005* (2013.01); *H01L 33/62* (2013.01); *H01L 2933/0066* (2013.01)

(56) References Cited

U.S. PATENT DOCUMENTS

| | | | |
|---|---|---|---|
| 2019/0096292 A1* | 3/2019 | Chang | H01L 33/62 |
| 2019/0244938 A1 | 8/2019 | Bang et al. | |
| 2020/0166659 A1* | 5/2020 | Fujiyoshi | H04N 25/633 |
| 2020/0319739 A1* | 10/2020 | Zou | G02F 1/133514 |
| 2020/0402443 A1* | 12/2020 | Lou | H10K 59/805 |
| 2020/0411607 A1* | 12/2020 | Jian | H10K 59/60 |
| 2021/0126075 A1* | 4/2021 | Wang | H10K 59/1213 |

FOREIGN PATENT DOCUMENTS

| | | |
|---|---|---|
| CN | 110033709 A | 7/2019 |
| CN | 110033732 A | 7/2019 |
| CN | 110034105 A | 7/2019 |

* cited by examiner

DISPLAY PANEL, SPLICING DISPLAY PANEL AND PREPARATION METHOD THEREOF

This application is the National Stage of International Application No. PCT/CN2019/118919, filed on Nov. 15, 2019, the entire contents of which are incorporated herein by reference.

FIELD

The disclosure relates to the technical field of display, in particular to a display panel, a splicing display panel and a preparation method thereof.

BACKGROUND

Due to some factors including process, a large display panel is generally formed by splicing multiple small display panels. The limitation of the splicing process determines that splicing seams between the small display panels are large, thus leading to a poor display effect.

SUMMARY

A display panel provided by an embodiment of the disclosure includes:
a base substrate; and
a plurality of display areas arranged on the base substrate;
Each of the plurality of display areas includes a plurality of pixel units; each of the plurality of pixel units includes a plurality of sub-pixels; and each of the plurality of sub-pixels includes a light-emitting chip.
In any one of the plurality of display areas,
a space between two adjacent columns of pixel units in a row direction has a first space size; and
a space between two adjacent rows of pixel units in a column direction has a second space size.
A space between two nearest display areas among the plurality of display areas in the row direction has a third space size, and the third space size is approximately same as the first space size; and/or
a space between two nearest display areas among the plurality of display areas in the column direction has a fourth space size, and the fourth space size is approximately same as the second space size.

Optionally, according to an embodiment of the present disclosure, sub-pixels in the each of the plurality of display areas are arranged in an array; and the each of the plurality of the sub-pixels further includes a driving circuit configured to drive the light-emitting chip.

Optionally, according to an embodiment of the present disclosure, the each of the plurality of display areas further includes: a plurality of first signal driving lines and a plurality of second signal driving lines located between the base substrate and light-emitting chips of sub-pixels in the display area.
The first signal driving lines and the second signal driving lines are crossed and insulated.
Driving circuits in each row of sub-pixels in the display area are electrically connected to a respective one of the first signal driving lines, and driving circuits in each column of sub-pixels in the display area are electrically connected to a respective one of the second signal driving lines.

Optionally, according to an embodiment of the present disclosure, the each of the plurality of display areas further includes:
a plurality of first signal transmission lines;
a plurality of second signal transmission lines; and
a driving chip electrically connected to the first signal transmission lines and the second signal transmission lines.
The plurality of first signal transmission lines, the plurality of second signal transmission lines and the driving chip are located on a side, facing away from the light-emitting chips, of the base substrate.
Each of the first signal driving lines is electrically connected to a respective one of the first signal transmission lines through a corresponding first via hole penetrating through the base substrate; and each of the second signal driving lines is electrically connected to a respective one of the second signal transmission lines through a corresponding second via hole penetrating through the base substrate.

Optionally, according to an embodiment of the present disclosure, each of the first signal driving lines corresponds to a respective one of first via holes; and the first via holes are located at a same end of the first signal driving lines.

Optionally, according to an embodiment of the present disclosure, each of the first signal driving lines corresponds to a respective one of first via holes; a part of the first via holes are located at one end of the first signal driving lines, and a rest part of the first via holes are located at another end of the first signal driving lines.

Optionally, according to an embodiment of the present disclosure, first via holes corresponding to odd-numbered rows of first signal driving lines are located at the one end of the first signal driving lines, and first via holes corresponding to even-numbered rows of first signal driving lines are located at the another end of the first signal driving lines.

Optionally, according to an embodiment of the present disclosure, each of the first signal driving lines corresponds to respective two of first via holes; one of the two first via holes is located at one end of the first signal driving line, and another one of the two first via holes is located at another end of the first signal driving line.

Optionally, according to an embodiment of the present disclosure, each of the second signal driving lines corresponds to a respective one of second via holes; and the second via holes are located at a same end of the second signal driving lines.

Optionally, according to an embodiment of the present disclosure, each of the second signal driving lines corresponds to a respective one of the second via holes; a part of the second via holes are located at one end of the second signal driving lines, and a rest part of the second via holes are located at another end of the second signal driving lines.

Optionally, according to an embodiment of the present disclosure, second via holes corresponding to odd-numbered columns of second signal driving lines are located at the one end of the second signal driving lines, and second via holes corresponding to even-numbered columns of second signal driving lines are located at the another end of the second signal driving lines.

Optionally, according to an embodiment of the present disclosure, each of the second signal driving lines corresponds to respective two of second via holes; one of the two second via holes is located at one end of the second signal driving line, and another one of the two second via holes is located at another end of the second signal driving line.

A method for preparing the display panel provided by an embodiment of the disclosure includes: forming the plurality of display areas on the same base substrate.
Each of the plurality of display areas includes a plurality of pixel units; each of the plurality of pixel units includes a plurality of sub-pixels; and each of the plurality of sub-pixels includes a light-emitting chip;

In any one of the plurality of display areas, a space between two adjacent columns of pixel units in a row direction has a first space size; and a space between two adjacent rows of pixel units in a column direction has a second space size.

A space between two nearest display areas among the plurality of display areas in the row direction has a third space size, and the third space size is approximately same as the first space size; and/or a space between two nearest display areas among the plurality of display in the column direction has a fourth space size, and the fourth space size is approximately the same as the second space size.

Optionally, according to an embodiment of the present disclosure, said forming the plurality of display areas includes:

in each of the plurality of display areas on the base substrate:

forming a plurality of first signal driving lines and a plurality of second signal driving lines, wherein the first signal driving lines and the second signal driving lines are crossed and insulated;

forming a plurality of first signal transmission lines and a plurality of second signal transmission lines on a side, facing away from the first signal driving lines, of the base substrate;

forming a plurality of first via holes and a plurality of second via holes; and forming a conductive material in each of the first via holes and each of the second via holes, so that each of the first signal driving lines is electrically connected to a respective one of the first signal transmission lines through a corresponding first via hole, and each of the second signal driving lines is electrically connected to a respective one of the second signal transmission lines through a corresponding second via hole.

Optionally, according to an embodiment of the present disclosure, said forming the conductive material in each of the first via holes and each of the second via holes includes:

forming a first photoresist layer on a side, facing the first signal driving lines, of the base substrate; and forming a second photoresist layer on the side, facing away from the first signal driving lines, of the base substrate; wherein the first photoresist layer has a plurality of third via holes and a plurality of fourth via holes, and the second photoresist layer has a plurality of fifth via holes and a plurality of sixth via holes; and an orthographic projection of each of the third via holes on the base substrate covers an orthographic projection of a respective one of the first via holes on the base substrate, an orthographic projection of each of the fourth via holes on the base substrate covers an orthographic projection of a respective one of the second via holes on the base substrate, an orthographic projection of each of the fifth via holes on the base substrate covers an orthographic projection of a respective one of the first via holes on the base substrate, and an orthographic projection of each of the sixth via holes on the base substrate covers an orthographic projection of a respective one of the second via holes on the base substrate; and filling each of the first via holes, each of the second via holes, each of the third via holes, each of the fourth via holes, each of the fifth via holes and each of the sixth via holes with the conductive material by one of sputtering process, atomic layer deposition process, evaporation process, electron beam evaporation process and electrochemical deposition process.

Optionally, according to an embodiment of the present disclosure, after said filling each of the first via holes, each of the second via holes, each of the third via holes, each of the fourth via holes, each of the fifth via holes and each of the sixth via holes with the conductive material, the method further includes: removing the first photoresist layer and the second photoresist layer.

A splicing display panel provided by an embodiment of the disclosure includes a plurality of the display panels.

a space between two adjacent display areas, respectively in two nearest display panels among the plurality of display panels, in the row direction has a fifth space size, and the fifth space size is approximately same as the first space size; and/or a space between two adjacent display areas, respectively in two nearest display panels among the plurality of display panels, in the column direction has a sixth space size, and the sixth space size is approximately same as the second space size.

DETAILED DESCRIPTION OF THE EMBODIMENTS

Figure 1:
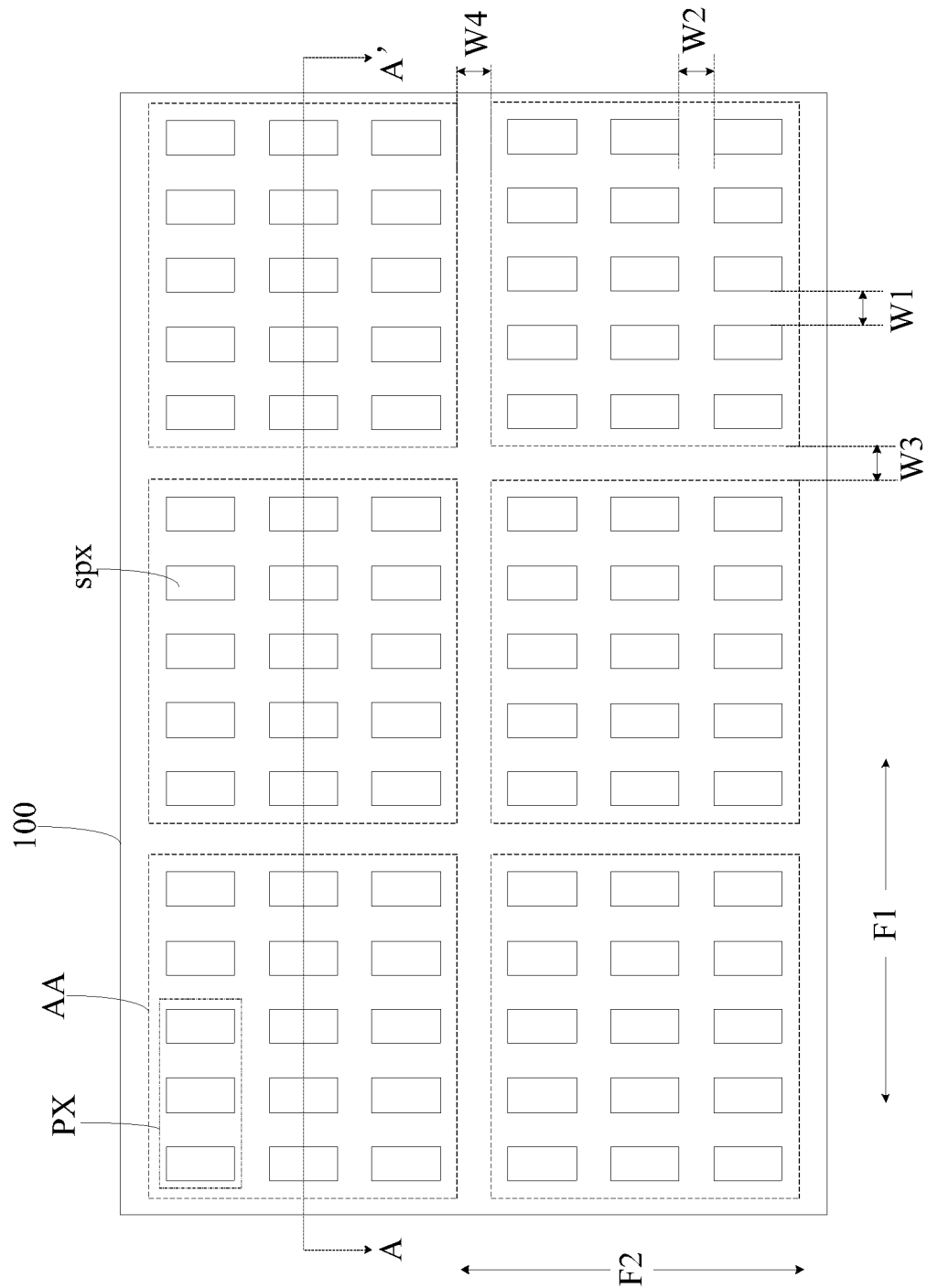
FIG. 1 is a top view of a display panel provided by an embodiment of the disclosure.

In order to make the purpose, technical solution and advantages of the embodiments of the disclosure clearer, the technical solution of the embodiments of the disclosure will be described clearly and completely with reference to the drawings of the embodiments of the disclosure. Obviously, the described embodiments are only part of the embodiments of the disclosure, not all of the embodiments. Besides, the embodiments in the disclosure and the features in the embodiments may be combined with each other without conflict. Based on the embodiments described in the disclosure, all other embodiments obtained by those of ordinary skilled in the art without creative labor are within the scope of protection of the disclosure.

Unless otherwise defined, technical terms or scientific terms used in the disclosure shall have the ordinary meaning understood by those with ordinary skilled in the field to which the disclosure belongs. The words "first", "second" and the like used in the disclosure do not indicate any order, quantity or importance, but are only used to distinguish different components. Words like "comprise" or "include" mean that the elements or articles appearing before the words cover the elements or articles listed after the words and their equivalents, and do not exclude other elements or articles. Words like "connect" or "connected" are not limited to physical or mechanical connection, but may include electrical connection, whether direct or indirect.

It should be noted that the sizes and shapes of the figures in the drawings do not reflect true proportions, and are only for the purpose of schematically illustrating the disclosure. Throughout the present disclosure, the same or similar reference numerals refer to the same or similar elements or elements having the same or similar functions.

Figure 2:
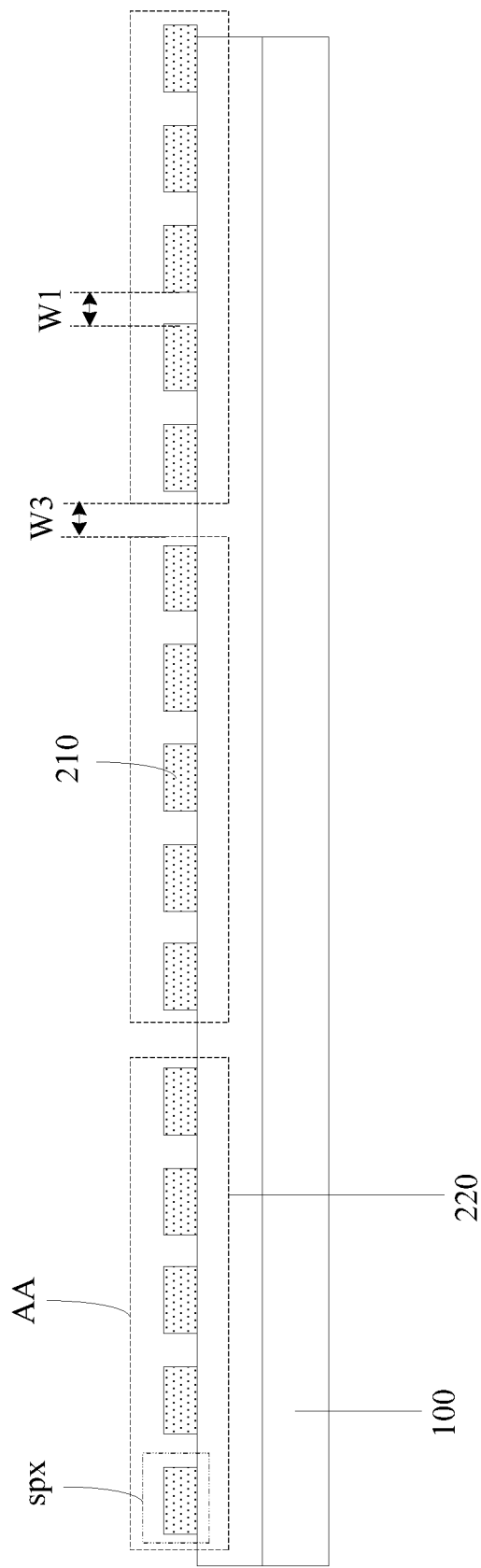
FIG. 2 is a cross-sectional view along an AA' direction of the display panel shown in FIG. 1.

As shown in FIG. 1 and FIG. 2, a display panel provided by an embodiment of the disclosure includes a base substrate 100 and a plurality of display areas AA.

The plurality of display areas AA are arranged on the base substrate 100. Each of the display areas AA includes a plurality of pixel units PX. Each of the pixel units PX includes a plurality of sub-pixels spx. Each of the sub-pixels spx includes a light-emitting chip 210;

In the same display area AA, a space between two adjacent columns of pixel units PX in a row direction F1 has a first space size W1, and a space between two adjacent rows of pixel units PX in a column direction F2 has a second space size W2;

A space between the nearest display areas AA in the row direction F1 has a third space size W3. The third space size W3 may be approximately the same as the first space size W1. And/or, a space between the nearest display areas AA in the column direction F2 has a fourth space size W4. The fourth space size W4 may be approximately the same as the second space size W2.

In the display panel provided by the embodiment of the disclosure, a plurality of display areas are arranged on one base substrate, and each display area is provided with a plurality of light-emitting chips. Thus when the display panel is prepared, the plurality of display areas can be formed after the light-emitting chips are manufactured on one base substrate. The third space size can be approximately the same as the first space size and/or the fourth space size can be approximately the same as the second space size, so that the display areas can be transitioned uniformly from one to another, thereby solving the problem of large splicing seams caused by the low splicing accuracy of the splicing process and improving the display effect. In addition, since a plurality of display areas for splicing can be formed by using one base substrate, the traditional approach that a plurality of independent display areas are prepared first and then spliced into a display panel can be replaced, which means that a large display panel can be formed without the splicing process, so that the production efficiency is improved.

In specific implementation, in some embodiments of the disclosure, as shown in FIG. 1 and FIG. 2, all the display areas AA may share one base substrate 100. For example, there may be six display areas, and the six display areas AA share the same base substrate 100. In this way, only one base substrate 100 is needed to form a large display panel. In addition, since the plurality of display areas AA are directly formed on the base substrate 100, which is equivalent to partitioning on the base substrate 100, and two adjacent display areas AA share one sub-micron-sized boundary, so that a large display panel can be formed without the splicing process. Therefore, the phenomenon that splicing seams are visible with the increase of resolution is avoided, and the influence of the splicing seams on the display effect is further reduced. In addition, the size of the base substrate 100 can be utilized to the maximum extent, so that a frame-less display panel or a display panel with an ultra-narrow frame can be obtained.

It should be noted that the number of the display areas provided on the base substrate may be 2, 3, 4, 6 or more. In practical application, it can be determined according to the actual application environment, which is not limited here.

Exemplarily, in the preparation process, the base substrate 100 is usually a glass substrate. Generally, the size of a glass substrate may reach about 110 inches, while the size of the display area AA is usually 11 inches. Therefore, all display panels within 110 inches can be prepared by using one base substrate 100. In this way, large display panels can be produced without physical splicing.

In specific implementation, in some embodiments of the disclosure, as shown in FIG. 1 and FIG. 2, in the same display area AA, a space between two adjacent columns of pixel units PX in the row direction F1 has the first space size W1. Further, the first space sizes W1 in respective display areas AA may be substantially the same. It should be noted that, in the actual process, due to the limitation of process conditions or other factors, the first space sizes W1 in respective display areas AA are not completely the same, and there may be some differences. Therefore, any case where the first space sizes W1 in respective display areas AA are roughly the same falls within the protection scope of the disclosure. For example, the first space sizes W1 in respective display areas AA may be the same as allowed within the allowable error range.

Exemplarily, for the display areas AA sharing the same base substrate 100, a space between the nearest display areas AA in the row direction F1 has the third space size W3, and the third space size W3 may be made approximately the same as the first space size W1. In this way, by making the third space size W3 approximately the same as the first space size W1, the space between the nearest display areas AA in the row direction F1 and the space between two adjacent columns of pixel units PX in the display areas AA in the row direction F1 can be made approximately the same, that is to say, the space between display pictures of two adjacent display areas AA of the same base substrate 100 can be approximately the same as the space between the pixel units PX, thereby further reducing the problem of visibility of splicing seams.

It should be noted that, in actual process, due to the limitation of process conditions or other factors, the third space size W3 and the first space size W1 are not completely the same, and there may be some differences. In specific implementation, when the ratio of the third space size W3 to the first space size $$W1 \frac{W3}{W1}$$

meets $$0.6 \leq \frac{W3}{W1} \leq 1.4,$$

it can be said that the third space size W3 and the first space size W1 are the same. For example, in practical applications, if W1=500 μm, when W3 is between 300 μm and 700 μm, it can be said that the third space size W3 is the same as the first space size W1.

Due to the limitation of the identifying ability of human eyes, the space between the display areas may not be noticed when it is within a certain range. Therefore, the ratio of the third space size W3 to the first space size $$W1\frac{W3}{W1}$$

can also be set according to a critical value of the space between the display areas that human eyes can identify.

In some embodiments, the ratio of the third space size $$W1\frac{W3}{W1}$$

can also be set according to the combination of the above two methods, so as to satisfy the condition that the third space size W3 is approximately the same as the first space size W1. All of these fall within the protection scope of the disclosure.

In specific implementation, in some embodiments of the disclosure, as shown in FIG. 1, in the same display area AA, the space between two adjacent rows of pixel units PX in the column direction F2 has the second space size W2. Further, the second space sizes W2 in respective display areas AA may be substantially the same. It should be noted that, in the actual process, due to the limitation of process conditions or other factors, the second space sizes W2 in respective display areas AA are not completely the same, and there may be some differences. Therefore, any case where the second space sizes W2 in respective display areas AA are roughly the same falls within the protection scope of the disclosure. For example, the second space sizes W2 in respective display areas AA may be the same as allowed within the allowable error range.

Exemplarily, for the display areas AA sharing the same base substrate 100, the space between the nearest display areas AA in the column direction F2 has the fourth space size W4, and the fourth space size W4 may be made approximately the same as the second space size W2. In this way, by making the fourth space size W4 approximately the same as the second space size W2, the space between the nearest display areas AA in the column direction F2 and the space between two adjacent rows of pixel units PX in the display areas AA in the column direction F2 can be made approximately the same, that is to say, the space between display pictures of two adjacent display areas AA of the same base substrate 100 can be approximately the same as the space between the pixel units PX, thereby further reducing the problem of visibility of splicing seams.

It should be noted that, in actual process, due to the limitation of process conditions or other factors, the fourth space size W4 and the second space size W2 are not completely the same, and there may be some differences. In specific implementation, when the ratio of the fourth space size W4 to the second space size $$W2\frac{W4}{W2}$$

meets $$0.6 \leq \frac{W4}{W2} \leq 1.4,$$

it can be said that the fourth space size W4 and the second space size W2 are the same. For example, in practical applications, if W2=500 μm, when W4 is between 300 μm and 700 μm, it can be said that the fourth space size W4 is the same as the second space size W2.

Due to the limitation of the identifying ability of human eyes, the space between the display areas may not be noticed when it is within a certain range. Therefore, the ratio of the fourth space size W4 to the second space size $$W2\frac{W4}{W2}$$

can also be set according to a critical value of the space between the display areas that human eyes can identify.

In some embodiments, the ratio of the fourth space size W4 to the second space size $$W2\frac{W4}{W2}$$

can also be set according to the combination of the above two methods, so as to satisfy the condition that the fourth space size W4 is approximately the same as the second space size W2. All of these fall within the protection scope of the disclosure.

In specific implementation, in some embodiments of the disclosure, as shown in FIG. 1, the display panel may include a plurality of pixel units PX arranged in an array in each of the display areas AA. Each of the pixel units PX may include a plurality of sub-pixels spx. Further, the sub-pixels spx in the display area AA may be arranged in an array. Exemplarily, a pixel unit PX may include red sub-pixel(s), green sub-pixel(s) and blue sub-pixel(s), so that color display can be realized through the mixing of red, green and blue. Alternatively, a pixel unit PX may include red sub-pixel(s), green sub-pixel(s), blue sub-pixel(s) and white sub-pixel(s), so that color display can be realized through the mixing of red, green, blue and white. In practical application, the luminous color and specific number of the sub-pixels spx in each of the pixel units PX can be determined according to the actual application environment, which is not limited here.

In specific implementation, in some embodiments of the disclosure, a sub-pixel spx may further include a driving circuit configured to drive the light-emitting chip 210 to emit light. The light-emitting chip 210 may be at least one of a light emitting diode (LED), a micro light emitting diode (Micro LED) and a mini light emitting diode (Mini LED). For example, an positive electrode of the Micro LED serves as a first end of the light-emitting chip 210, and a negative electrode of the Micro LED serves as a second end of the light-emitting chip 210.

Figure 3A:
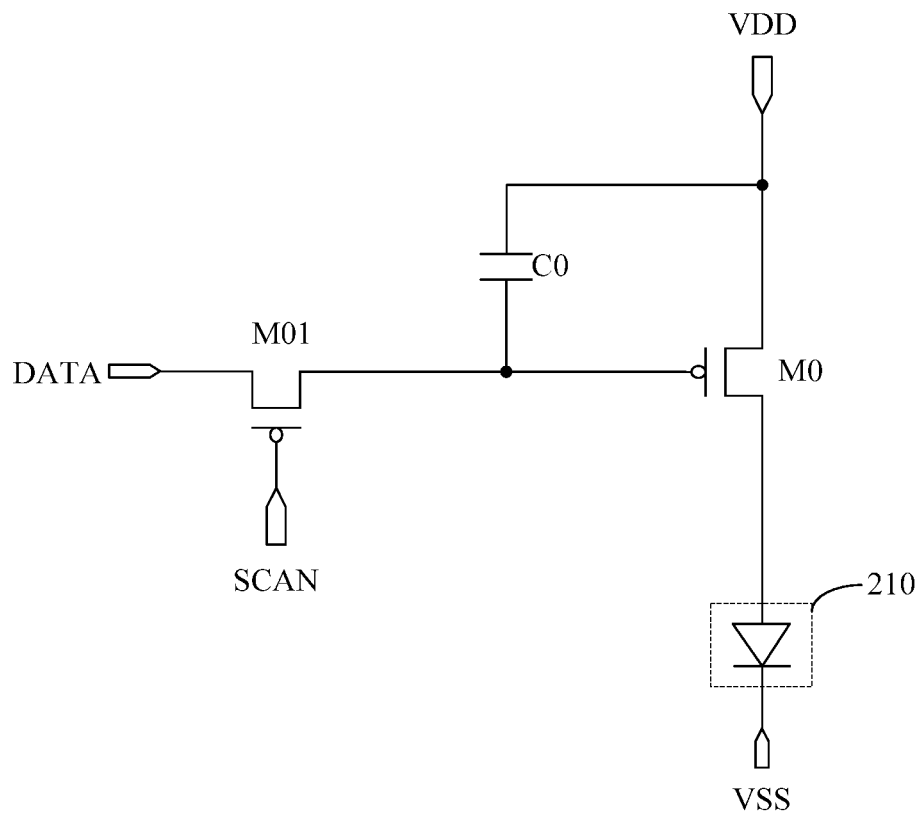
FIG. 3A is a structural diagram of a driving circuit provided by an embodiment of the disclosure.

In specific implementation, in some embodiments of the disclosure, as shown in FIG. 3A, the driving circuit may include a switching transistor M01, a driving transistor M0 and a storage capacitor C0.

The gate of the first switching transistor M01 is electrically connected to a scan signal terminal SCAN, a first electrode of the first switching transistor M01 is electrically connected to a data signal terminal DATA, and a second electrode of the first switching transistor M01 is electrically connected to the gate of the driving transistor M0.

A first end of the driving transistor M0 is electrically connected to a first power supply terminal VDD, a second end of the driving transistor M0 is electrically connected to the first end of the light-emitting chip 210, and the second end of the light-emitting chip 210 is electrically connected to a second power supply terminal VSS.

A first end of the storage capacitor C0 is electrically connected to the first power supply terminal VDD, and a second end of the storage capacitor C0 is electrically connected to the gate of the driving transistor M0.

The working process of the above-mentioned driving circuit may be basically the same as that in the related art, and will not be repeated here. In actual application, the driving circuit may also be of other structures, which is not limited here.

Figure 3B:
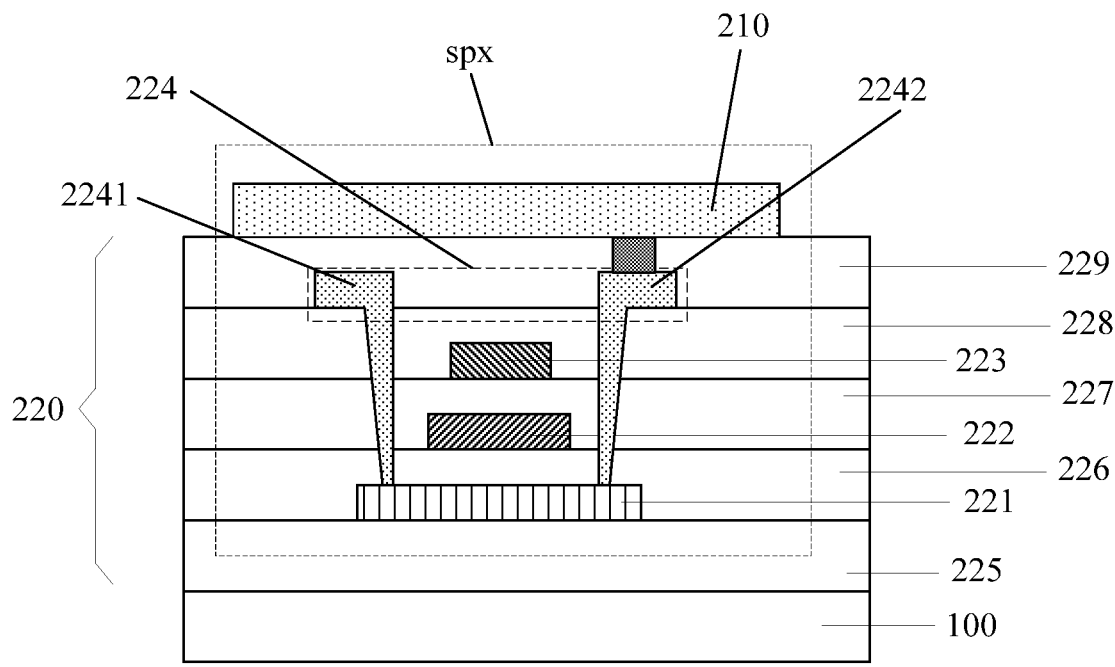
FIG. 3B is a cross-sectional view of a sub-pixel in a display panel provided by an embodiment of the disclosure.

Exemplarily, as shown in FIGS. 2 to 3b, the display panel may further include a transistor array layer 220 for forming film layers of the transistors and film layers of the capacitor. The transistor array layer 220 is located between the light-emitting chip 210 and the base substrate 100. Exemplarily, the transistor array layer 220 may include an active layer 221 on one side of the base substrate 100, a gate layer 222 on a side, facing away from the base substrate 100, of the active layer 221, a capacitor electrode layer 223 on a side, facing away from the base substrate 100, of the gate layer 222, and a source-drain electrode layer 224 (having a source electrode 2241 and a drain electrode 2242) on a side, facing away from the base substrate 100, of the capacitor electrode layer 223. The active layer 221, the gate layer 222 and the capacitor electrode layer 223 are insulated from one another, and the source-drain electrode layer 224, the gate layer 222 and the capacitor electrode layer 223 are insulated from one another. The source electrode 2241 and the drain electrode 2242 are electrically connected to the active layer 221. Furthermore, the transistor array layer 220 also includes a buffer layer 225 between the base substrate 100 and the active layer 221, a gate insulating layer 226 between the active layer 221 and the gate layer 222 to insulate the active layer 221 from the gate layer 222, an interlayer dielectric layer 227 between the gate layer 222 and the capacitor electrode layer 223 to insulate the gate layer 222 from the capacitor electrode layer 223, an interlayer insulating layer 228 between the capacitor electrode layer 223 and the source-drain electrode layer 224 to insulate the capacitor electrode layer 223 from the source-drain electrode layer 224, and a planarization layer 229 between the source-drain electrode layer 224 and the light-emitting chip 210. The first end of the light-emitting chip 210 is electrically connected to the drain electrode 2242 through a via hole penetrating through the planarization layer 229, the second end of the light-emitting chip 210 is electrically connected to a cathode power line, so as to provide a driving signal to the light-emitting chip 210 through the drain electrode 2242, and a low voltage signal is provided to the second power supply terminal VSS through the cathode power supply line, so as to provide the low voltage signal to the second end of the light-emitting chip 210, thereby driving the light-emitting chip 210 to emit light. In addition, the capacitor electrode layer 223 and the gate layer 222 form a capacitor structure. It should be noted that FIG. 3B only takes one transistor in one sub-pixel spx as an example.

Figure 4:
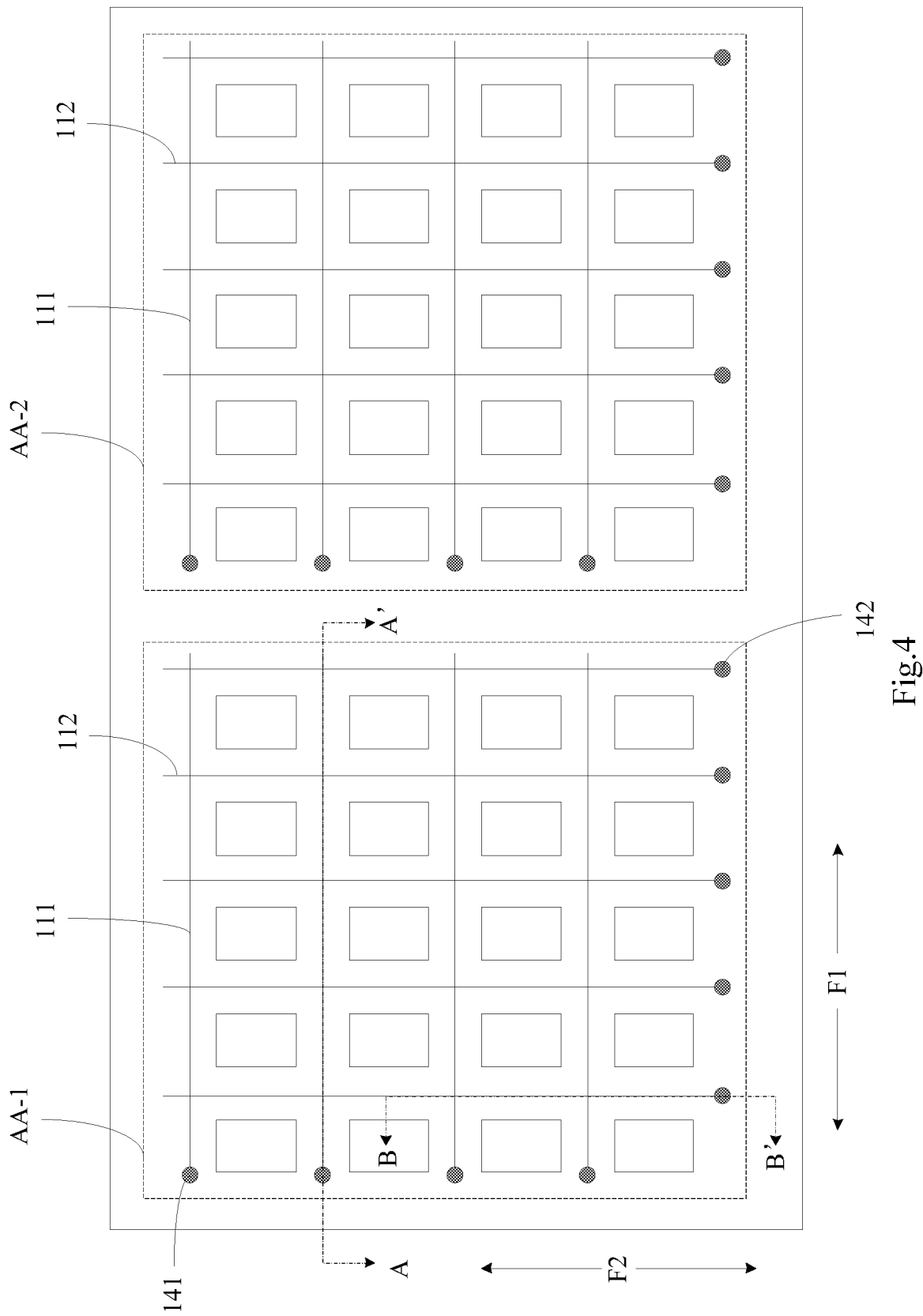
FIG. 4 is a top view of a light emitting side of a display panel provided by an embodiment of the disclosure.
Figure 6A:
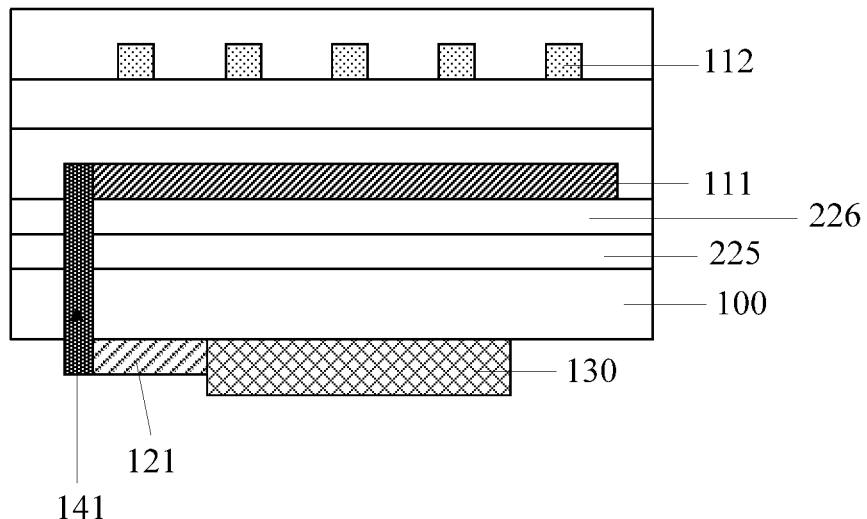
FIG. 6A is a cross-sectional view along an AA' direction of the display panel shown in FIG. 4.
Figure 6B:
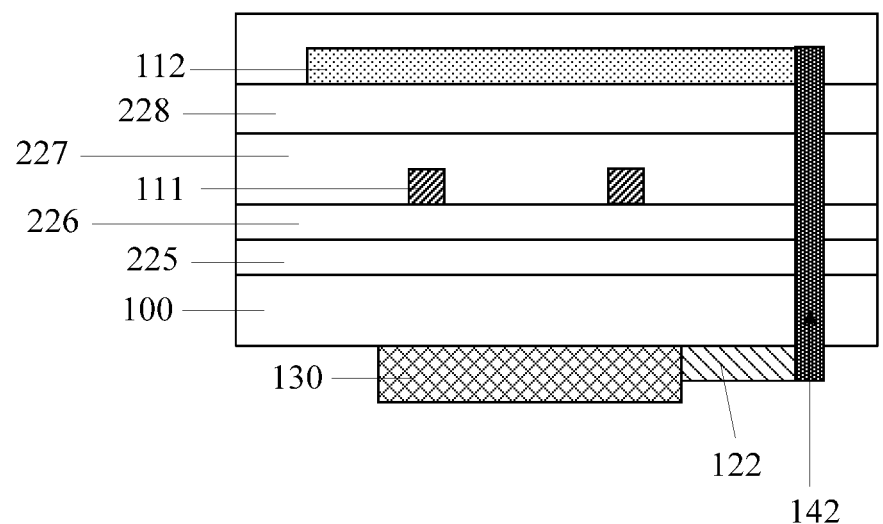
FIG. 6B is a cross-sectional view along a BB' direction of the display panel shown in FIG. 4.

In specific implementation, in some embodiments of the disclosure, as shown in FIG. 4, FIG. 6A and FIG. 6B, each of the display areas AA may include a plurality of first signal driving lines 111 and a plurality of second signal driving lines 112. The first signal driving lines 111 and the second signal driving lines 112 are crossed and insulated. Exemplarily, the first signal driving lines 111 and the second signal driving lines 112 are located between the base substrate 100 and the light-emitting chips 210. It should be noted that FIG. 4 illustrates only two display areas AA, one of which is AA-1 and the other is AA-2.

Exemplarily, as shown in FIG. 4, the first signal driving lines 111 may extend in the row direction F1 of the sub-pixels spx, and the second signal driving lines 112 may extend in the column direction F2 of the sub-pixels spx. The driving circuits in one row of sub-pixels spx are electrically connected to one of the first signal driving lines 111, and the driving circuits in one column of sub-pixels spx are electrically connected to one of the second signal driving lines 112. In this way, signals can be transmitted to the driving circuits through the first signal driving lines 111 and the second signal driving lines 112, so that the driving circuits drive the light-emitting chips 210 to emit light. For example, the scan signal terminals SCAN of the driving circuits in one row of sub-pixels spx are electrically connected to one of the first signal driving lines 111, and the data signal terminals DATA of the driving circuits in one column of sub-pixels spx are electrically connected to one of the second signal driving lines 112. Of course, the disclosure includes but is not limited to this.

Exemplarily, the first signal driving lines 111 may be disposed in the same layer as the gate layer 222. In this way, when the display panel is prepared, the patterns of the gate layer 222 and the first signal driving lines 111 can be simultaneously formed by a one-time patterning process, and the first signal driving lines 111 are not needed to be prepared separately, so that the manufacturing process can be simplified, the production cost can be saved, and the production efficiency can be improved.

Exemplarily, the second signal driving lines 112 may be disposed in the same layer as the source-drain electrode layer 224. In this way, when the display panel is prepared, it is only required to change an original pattern when forming the pattern of the source-drain electrode layer 224, the pattern of the source-drain electrode layer 224 and the pattern of the second signal driving lines 112 can be simultaneously formed by a one-time patterning process, and the second signal driving lines 112 are not needed to be prepared separately, so that the manufacturing process can be simplified, the production cost can be saved, and the production efficiency can be improved.

In specific implementation, in some embodiments of the disclosure, as shown in FIGS. 4 to 6b, each of the display areas AA (e.g., AA-1, AA-2) may include a plurality of first signal transmission lines 121, a plurality of second signal transmission lines 122, and a driving chip 130 electrically connected to the first signal transmission lines 121 and the second signal transmission lines 122. The first signal transmission lines 121, the second signal transmission lines 122, and the driving chip are located on a side, facing away from the light-emitting chips 210, of the base substrate 100. One of the first signal driving lines 111 is electrically connected to one of the first signal transmission lines 121 through a corresponding first via hole 141 penetrating through the base substrate 100; and one of the second signal driving lines 112 is electrically connected to one of the second signal transmission lines 122 through a corresponding second via hole 142 penetrating through the base substrate 100. In this way, when the display panel is driven for display, the driving chips 130 can generate a driving signal for driving the light-emitting chips 210 to emit light, and then the driving signal is transmitted to the first signal driving lines 111 and the second signal driving lines 112 through the first signal transmission lines 121 and the second signal transmission lines 122, respectively, so as to drive the light-emitting chips 210 to emit light.

Exemplarily, as shown in FIG. 6A, the first via hole 141 may penetrate through the base substrate 100, the buffer layer 225, and the gate insulating layer 226. That is, one of the first signal driving lines 111 is electrically connected to one of the first signal transmission lines 121 through the conductive material in the first via hole 141 penetrating through the base substrate 100, the buffer layer 225 and the gate insulating layer 226. Of course, the disclosure includes but is not limited to this.

Exemplarily, as shown in FIG. 6B, the second via hole 142 may penetrate through the base substrate 100, the buffer layer 225, the gate insulating layer 226, the interlayer dielectric layer 227, and the interlayer insulating layer 228. That is, one of the second signal driving lines 112 is electrically connected to one of the second signal transmission lines 122 through the conductive material in the second via hole 142 penetrating through the base substrate 100, the buffer layer 225, the gate insulating layer 226, the interlayer dielectric layer 227 and the interlayer insulating layer 228. Of course, the disclosure includes but is not limited to this.

In specific implementation, in some embodiments of the disclosure, when the display panel is viewed from above, the first via hole 141 may be rectangular, circular, elliptical, etc. Exemplarily, the size of the first via hole 141 may be 5-50 μm. For example, the size of the first via hole 141 may be 5 μm, 10 μm, 15 μm, 20 μm, 30 μm, 40 μm or 50 μm, which is not limited here.

In specific implementation, in some embodiments of the disclosure, when the display panel is viewed from above, the second via hole 142 may be rectangular, circular, elliptical, etc. For example, the size of the second via hole 142 may be 5-50 For example, the size of the second via hole 142 may be 5 μm, 10 μm, 15 μm, 20 μm, 30 μm, 40 μm or 50 μm, which is not limited here.

In specific implementation, in some embodiments of the disclosure, the materials of the first signal driving lines 111, the first signal transmission lines 121, the second signal driving lines 112 and the second signal transmission lines 122 may all be metal materials. Exemplarily, the metal materials may be gold, silver, copper, aluminum, etc.

Exemplarily, the materials of the first signal driving lines 111, the first signal transmission lines 121, the second signal driving lines 112 and the second signal transmission lines 122 may be the same. Further, the conductive material in the first via hole and the second via hole may be the same as the material of the first signal driving lines 111. Of course, the disclosure includes but is not limited to this.

In specific implementation, in some embodiments of the disclosure, the first signal transmission lines 121 are electrically connected to pins of the driving chips 130 through bonding terminals, and the second signal transmission lines 122 are also electrically connected to the pins of the driving chip 130 through bonding terminals.

In specific implementation, in some embodiments of the disclosure, the first signal transmission lines 121 and the second signal transmission lines 122 may be arranged on the same layer, made of the same material and insulated. In this way, when the display panel is prepared, the patterns of the first signal transmission lines 121 and the second signal transmission lines 122 can be simultaneously formed by a one-time patterning process, which can simplify the manufacturing process, save the production cost and improve the production efficiency.

Figure 5:
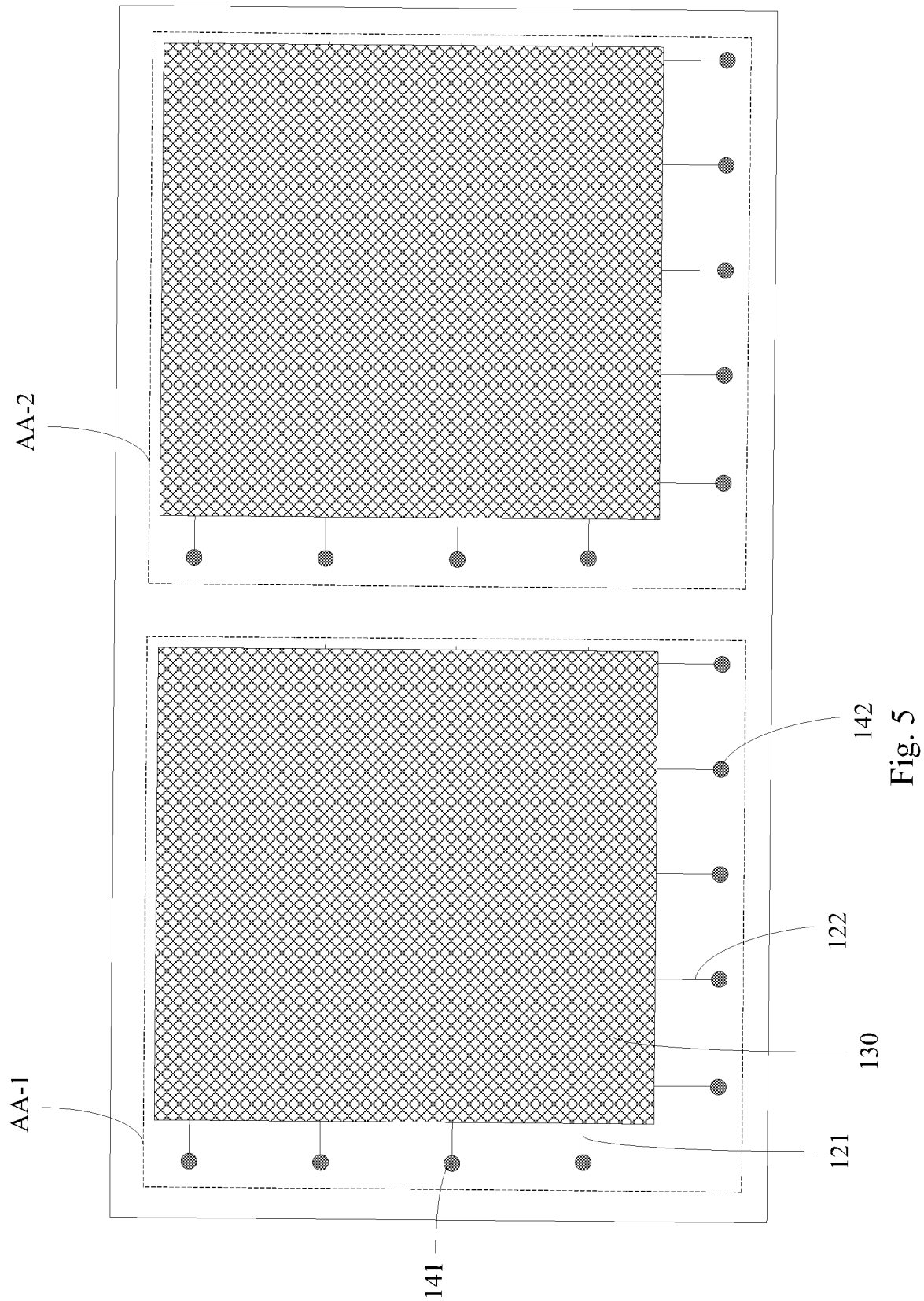
FIG. 5 is a top view of a side, facing away from light-emitting chips, of a display panel provided by an embodiment of the disclosure.

In specific implementation, in some embodiments of the disclosure, as shown in FIG. 4 and FIG. 5, one of the first signal driving lines 111 may correspond to one of the first via holes 141. In this way, there are only a few first via holes 141 on the base substrate 100, which not only simplifies the design difficulty of the first via holes 141, but also improves the reliability of the base substrate 100.

In specific implementation, in some embodiments of the disclosure, as shown in FIG. 4 and FIG. 5, the first via holes 141 in the same display area AA, i.e., the display areas AA-1 and AA-2, may be located at the same end of the first signal driving lines 111. Exemplarily, all the first via holes 141 in each of the display areas AA, i.e., the display areas AA-1 and AA-2, are located at the same end of the first signal driving lines 111. Further, the first via holes 141 in each of the display areas AA, i.e., the display areas AA-1 and AA-2, are located at the same positions of the first signal driving lines 111. For example, the first via holes 141 in each of the display areas AA, i.e., the display areas AA-1 and AA-2, are located at the left end of the first signal driving lines 111. Alternatively, the first via holes 141 in the display areas AA-1 and AA-2 are located at the right end of the first signal driving lines 111. This can further simplify the design difficulty of the first via holes 141.

In specific implementation, in some embodiments of the disclosure, as shown in FIG. 4 and FIG. 5, one of the second signal driving lines 112 may correspond to one of the second via holes 142. In this way, there are only a few second via holes 142 on the base substrate 100, which not only simplifies the design difficulty of the second via holes 142, but also improves the reliability of the base substrate 100.

In specific implementation, in some embodiments of the disclosure, as shown in FIG. 4 and FIG. 5, the second via holes 142 in the same display area AA, i.e., the display areas AA-1 and AA-2, can be located at the same end of the second signal driving lines 112. Exemplarily, all the second via holes 142 in each of the display areas AA, i.e., the display areas AA-1 and AA-2, are located at the same end of the second signal driving lines 112. Further, the second via holes 142 in each of the display areas AA, i.e., the display areas AA-1 and AA-2, are located at the same positions of the second signal driving lines 112. For example, the second via holes 142 in each of the display areas AA, i.e., the display areas AA-1 and AA-2, are located at the left end of the second signal driving lines 112. Alternatively, the second via holes 142 are located at the right end of the second signal driving lines 112. This can further simplify the design difficulty of the second via holes 142.

Figure 7A:
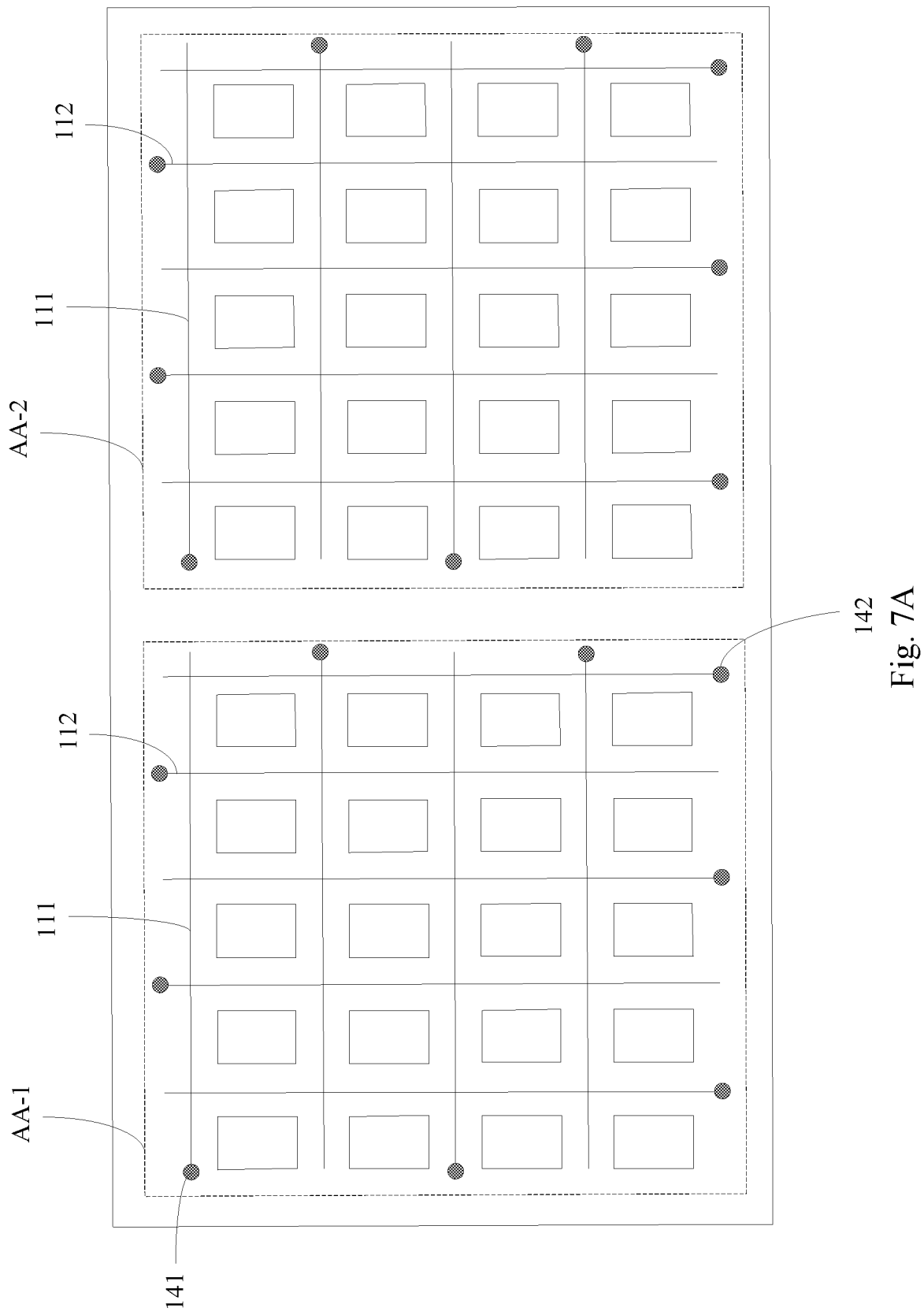
FIG. 7A is a top view of a display panel provided by an embodiment of the disclosure.
Figure 7B:
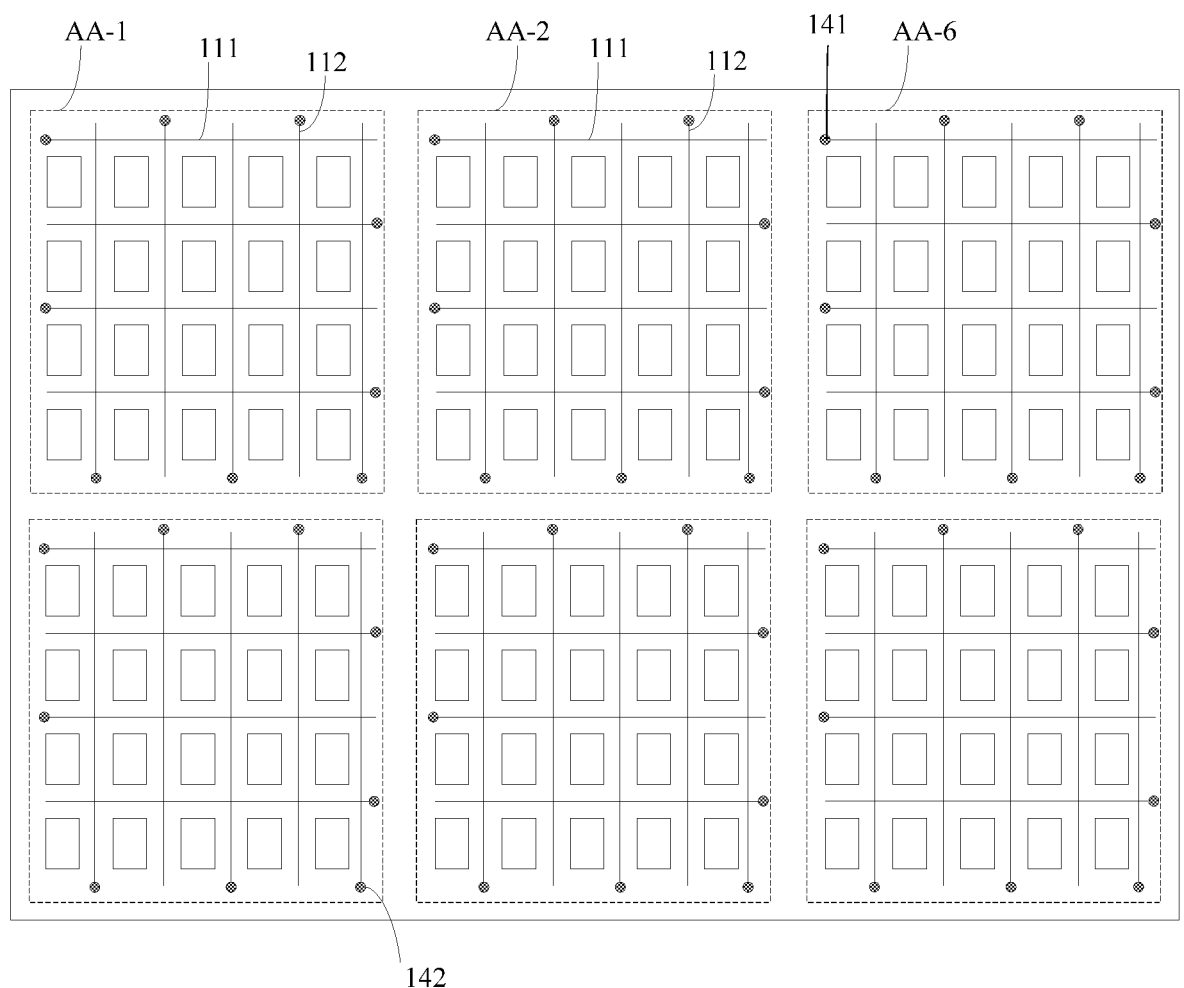
FIG. 7B is a top view of a display panel provided by an embodiment of the disclosure.

Some embodiments of the disclosure provide structural diagrams of other display panels, as shown in FIG. 7A and FIG. 7B, which are modifications of some of the above embodiments. Only the differences between the embodiments and the above embodiments will be explained below, and the similarities will not be repeated here.

In specific implementation, in some embodiments of the disclosure, as shown in FIG. 7A, the display panel may be provided with two display areas: AA-1 and AA-2. As shown in FIG. 7B, the display panel may also be provided with six display areas: AA-1, AA-2, AA-3, AA-4, AA-5 and AA-6.

In specific implementation, in some embodiments of the disclosure, as shown in FIG. 7A and FIG. 7B, in the same display area, part of the first via holes 141 are located at one end of the first signal driving lines 111, and the rest of the first via holes 141 are located at the other end of the first signal driving lines 111. Exemplarily, in the same display area, the first via holes 141 corresponding to odd-numbered rows of first signal driving lines 111 may be located at one end of the first signal driving lines 111, and the first via holes 141 corresponding to even-numbered rows of first signal driving lines 111 may be located at the other end of the first signal driving lines 111. For example, in each of the display areas, the first via holes 141 corresponding to odd-numbered rows of first signal driving lines 111 are located at the left end of the first signal driving lines 111, and the first via holes 141 corresponding to even-numbered rows of first signal driving lines 111 are located at the right end of the first signal driving lines 111. This can further improve the reliability of the base substrate 100. Of course, the disclosure includes but is not limited to this.

In specific implementation, in some embodiments of the disclosure, as shown in FIG. 7A and FIG. 7B, in the same display area, part of the second via holes 142 are located at one end of the second signal driving lines 112, and the rest of the second via holes 142 are located at the other end of the second signal driving lines 112. Exemplarily, in the same display area, the second via holes 142 corresponding to odd-numbered columns of second signal driving lines 112 are located at one end of the second signal driving lines 112, and the second via holes 142 corresponding to even-numbered columns of second signal driving lines 112 are located at the other end of the second signal driving lines 112. For example, in each of the display areas, the second via holes 142 corresponding to odd-numbered columns of second signal driving lines 112 are located at the lower end of the second signal driving lines 112, and the second via holes 142 corresponding to even-numbered columns of second signal driving lines 112 are located at the upper end of the second signal driving lines 112. This can further improve the reliability of the base substrate 100. Of course, the disclosure includes but is not limited to this.

In specific implementation, in some embodiments of the disclosure, as shown in FIG. 7A and FIG. 7B, the positions of the first via holes 141 are the same, and the positions of the second via holes 142 are the same. For example, the first via holes 141 corresponding to odd-numbered rows of first signal driving lines 111 in the display areas are located at the left end of the first signal driving lines 111, and the first via holes 141 corresponding to even-numbered rows of first signal driving lines 111 are located at the right end of the first signal driving lines 111. Furthermore, the second via holes 142 corresponding to odd-numbered columns of second signal driving lines 112 in the display areas are located at the lower end of the second signal driving lines 112, and the second via holes 142 corresponding to even-numbered columns of second signal driving lines 112 are located at the upper end of the second signal driving lines 112.

Figure 8:
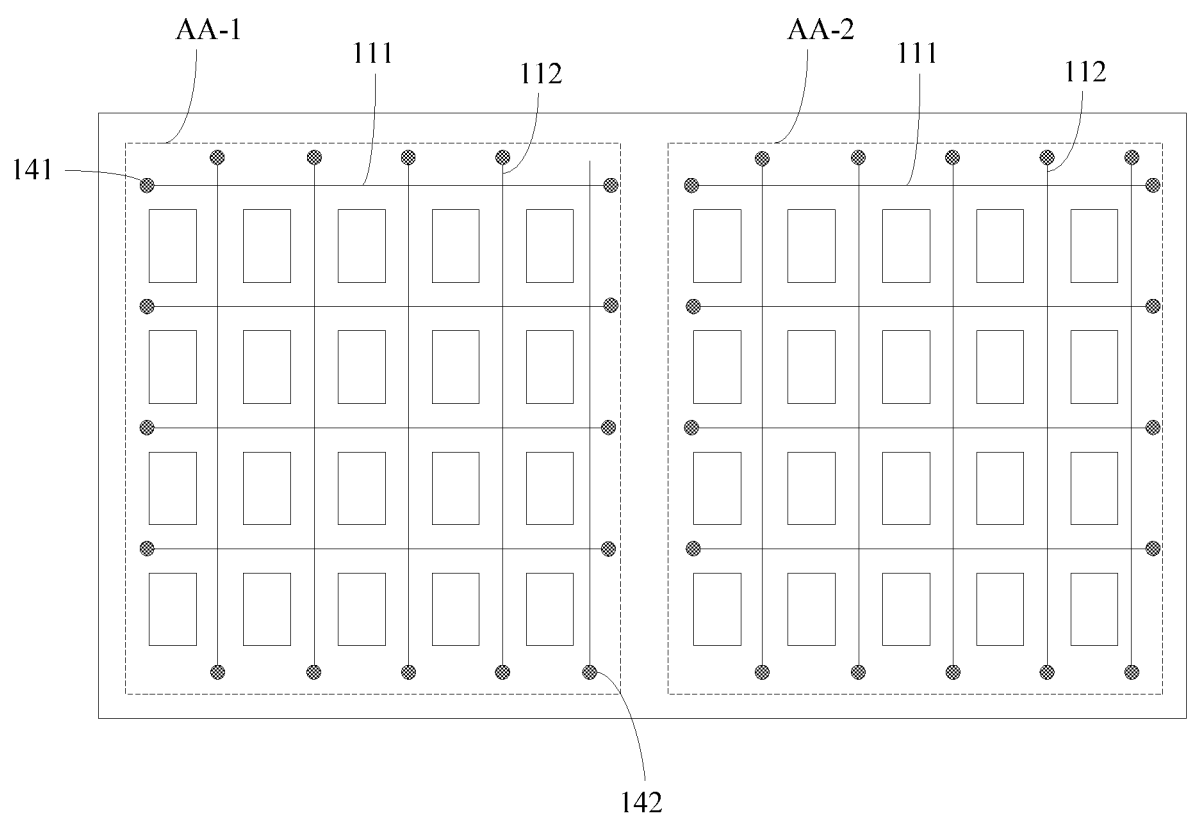
FIG. 8 is a top view of a display panel provided by an embodiment of the disclosure.

The embodiments of the disclosure provide structural diagrams of still other display panels, as shown in FIG. 8, which are modifications of some of the above embodiments. Only the differences between these embodiments and the above embodiments will be explained below, and the similarities will not be repeated here.

In specific implementation, in some embodiments of the disclosure, as shown in FIG. 8, one of the first signal driving lines 111 may correspond to two first via holes 141. In this way, the first signal driving line 111 and the corresponding first signal transmission line 121 can be electrically connected through the two first via holes 141, thereby reducing the resistance of the first signal driving line 111, reducing signal attenuation and further improving the display effect.

In specific implementation, in some embodiments of the disclosure, as shown in FIG. 8, for the two first via holes 141 corresponding to the same first signal driving line 111, one of the first via holes 141 is located at one end of the first signal driving line 111 and the other of the first via holes 141 is located at the other end of the first signal driving line 111. For example, a left end of each of the first signal driving lines 111 is provided with a first via hole 141, and a right end of the first signal driving line 111 is also provided with a first via hole 141.

In specific implementation, in some embodiments of the disclosure, as shown in FIG. 8, one of the second signal driving lines 112 may correspond to two second via holes 142. In this way, the second signal driving line 112 and the corresponding second signal transmission line 122 can be electrically connected through the two second via holes 142, thereby reducing the resistance of the second signal driving line 112, reducing signal attenuation and further improving the display effect.

In specific implementation, in some embodiments of the disclosure, as shown in FIG. 8, for the two second via holes 142 corresponding to the same second signal driving line 112, one of the second via holes 142 is located at one end of the second signal driving line 112 and the other of the second via holes 142 is located at the other end of the second signal driving line 112. For example, a left end of each of the second signal driving lines 112 is provided with a second via hole 142, and a right end of the second signal driving line 112 is also provided with a second via hole 142.

It should be noted that, under the condition of no conflict, the above embodiments and the features in the embodiments may be combined with each other, which is not repeated here.

Based on the same inventive concept, embodiments of the disclosure also provide a method for preparing the display panel, which may include the following steps: forming a plurality of display areas on the same base substrate; wherein each of the display areas includes a plurality of pixel units; each of the pixel units includes a plurality of sub-pixels; and each of the sub-pixels includes a light-emitting chip.

In specific implementation, in the same display area, a space between two adjacent columns of pixel units in a row direction has a first space size, and a space between two adjacent rows of pixel units in a column direction has a second space size.

A space between the nearest display areas in the row direction has a third space size. The third space size is approximately the same as the first space size; and/or a space between the nearest display areas in the column direction has a fourth space size. The fourth space size is approximately the same as the second space size. See the foregoing description for details, which will not be repeated here.

Figure 11:
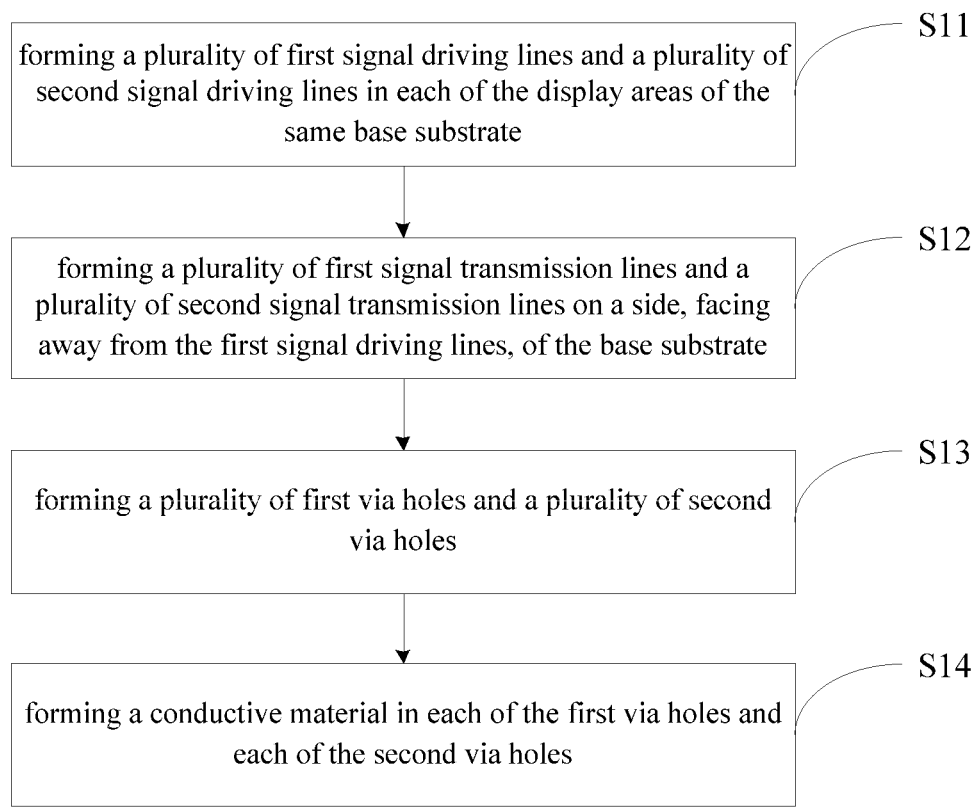
FIG. 11 is a flowchart of a preparation method provided by an embodiment of the disclosure.

In specific implementation, in some embodiments of the disclosure, forming the plurality of display areas AA, as shown in FIG. 11, may include the following steps.

S11, forming a plurality of first signal driving lines 111 and a plurality of second signal driving lines 112 in each of the display areas AA on the same base substrate 100. The first signal driving lines 111 and the second signal driving lines 112 are crossed and insulated;

S12, forming a plurality of first signal transmission lines 121 and a plurality of second signal transmission lines 122 on a side, facing away from the first signal driving lines 111, of the base substrate 100;

S13, forming a plurality of first via holes 141 and a plurality of second via holes 142;

S14, forming a conductive material in each of the first via holes 141 and each of the second via holes 142, so that one of the first signal driving lines 111 is electrically connected to one of the first signal transmission lines 121 through a corresponding first via hole 141, and one of the second signal driving lines 112 is electrically connected to one of the second signal transmission lines 122 through a corresponding second via hole 142. Exemplarily, the conductive material may be a metal material. For example, the conductive material may be the same as that of the first signal driving lines 111, so as to reduce resistance and interference to signal transmission.

Exemplarily, in step S11, forming the plurality of first signal driving lines 111 and the plurality of second signal driving lines 112 in each of the display areas AA on the same base substrate 100 may specifically include the following steps:

sequentially forming a buffer layer, an active layer and a gate insulating layer in each of the display areas AA on the same base substrate 100;

forming the first signal driving lines 111 and a gate layer on a side, facing away from the base substrate 100, of the gate insulating layer;

forming an interlayer dielectric layer on a side, facing away from the base substrate 100, of the first signal driving lines 111 and the gate layer;

sequentially forming a capacitor electrode layer and an interlayer insulating layer on a side, facing away from the base substrate 100, of the interlayer dielectric layer; and forming the second signal driving lines 112 and a source-drain layer on a side, facing away from the base substrate 100, of the interlayer insulating layer.

Exemplarily, in step S12, forming the plurality of first signal transmission lines 121 and the plurality of second signal transmission lines 122 on the side, facing away from the first signal driving lines 111, of the base substrate 100 may specifically include the following step: forming the plurality of first signal transmission lines 121 and the plurality of second signal transmission lines 122 on the side, facing away from the first signal driving lines 111, of the base substrate 100 by using the same patterning process.

Exemplarily, when one of the first signal driving lines 111 corresponds to one of the first via holes 141 and one of the second signal driving lines 112 corresponds to one of the second via holes 142, forming the plurality of first via holes 141 and the plurality of second via holes 142 penetrating through the base substrate 100 in step S13 may specifically include the following step: etching one end of each of the first signal transmission lines 121 and one end of each of the second signal transmission lines 122 to form the first via hole 141 and the second via hole 142 penetrating through the gate insulating layer, the interlayer insulating layer and the base substrate 100. For example, the structure of the formed display panel is shown in FIG. 4, which is not described in detail here.

Exemplarily, when one first signal driving line 111 corresponds to two first via holes 141 and one second signal driving line 112 corresponds to two second via holes 142, forming the plurality of first via holes 141 and the plurality of second via holes 142 penetrating through the base substrate 100 in step S13 may specifically include the following step: etching two ends of each of the first signal transmission lines 121 and two ends of each of the second signal transmission lines 122 to form the first via holes 141 and the second via holes 142 penetrating through the gate insulating layer, the interlayer insulating layer and the base substrate 100. For example, the structure of the formed display panel is shown in FIG. 8, which is not described in detail here.

Exemplarily, forming the conductive material in each of the first via holes 141 and each of the second via holes 142 may specifically include the following steps: forming a first photoresist layer on a side, facing the first signal driving lines 111, of the base substrate 100, and forming a second photoresist layer on the side, facing away from the first signal driving lines 111, of the base substrate 100. The first photoresist layer has a plurality of third via holes 143 and a plurality of fourth via holes 144, and the second photoresist layer has a plurality of fifth via holes and a plurality of sixth via holes; and an orthographic projection of one of the third via holes 143 on the base substrate 100 covers an orthographic projection of one of the first via holes 141 on the base substrate 100, an orthographic projection of one of the fourth via holes 144 on the base substrate 100 covers an orthographic projection of one of the second via holes 142 on the base substrate 100, an orthographic projection of one of the fifth via holes on the base substrate 100 covers an orthographic projection of one of the first via holes 141 on the base substrate 100, and an orthographic projection of one of the sixth via holes on the base substrate 100 covers an orthographic projection of one of the second via holes 142 on the base substrate 100; and filling each of the first via holes 141, each of the second via holes 142, each of the third via holes 143, each of the fourth via holes 144, each of the fifth via holes and each of the sixth via holes with the conductive material by one of sputtering process, atomic layer deposition process, evaporation process, electron beam evaporation process and electrochemical deposition process.

Exemplarily, after filling each of the first via holes 141, each of the second via holes 142, each of the third via holes 143, each of the fourth via holes 1144, each of the fifth via holes and each of the sixth via holes with the conductive material, the method may further include: removing the first photoresist layer and the second photoresist layer. This can reduce the thickness of the display panel. Of course, the first photoresist layer and the second photoresist layer may not be removed, so that the display panel may be permanently protected by the first photoresist layer and the second photoresist layer.

A first preset space exists between the edge of the orthographic projection of each of the third via holes 143 on the base substrate 100 and the edge of the orthographic projection of the corresponding first via hole 141 on the base substrate 100. A second preset space exists between the edge of the orthographic projection of each of the fourth via holes 144 on the base substrate 100 and the edge of the orthographic projection of the corresponding second via hole 142 on the base substrate 100. A third preset space exists between the edge of the orthographic projection of each of the fifth via holes on the base substrate 100 and the edge of the orthographic projection of the corresponding first via hole 141 on the base substrate 100. A fourth preset space exists between the edge of the orthographic projection of each of the sixth via holes on the base substrate 100 and the edge of the orthographic projection of the corresponding second via hole 142 on the base substrate 100. It should be noted that the first preset space, the second preset space, the third preset space and the fourth preset space may be determined according to the precision required in the preparation process, which is not limited here.

The above preparation method will be described below by taking the preparation of the display panel shown in FIG. 7A as an example. The preparation method provided by the embodiment of the disclosure may include the following steps:

(1) sequentially forming a buffer layer, an active layer and a gate insulating layer in each of the display areas AA (namely AA-1 and AA-2) of the same base substrate 100;

(2) forming the first signal driving lines 111 and a gate layer on the side, facing away from the base substrate 100, of the gate insulating layer;

(3) forming an interlayer dielectric layer, a capacitor electrode layer and an interlayer insulating layer on the side, facing away from the base substrate 100, of the first signal driving lines 111 and the gate layer;

(4) forming the second signal driving lines 112 and a source-drain layer on the side, facing away from the base substrate 100, of the interlayer insulating layer;

(5) forming the plurality of first signal transmission lines 121 and the plurality of second signal transmission lines 122 on the side, facing away from the first signal driving lines 111, of the base substrate 100 by using the same patterning process;

(6) etching one end of each of the first signal transmission lines 121 and one end of each of the second signal transmission lines 122 to form the first via holes 141 and the second via holes 142 penetrating through the gate insulating layer, the interlayer insulating layer and the base substrate 100;

(7) forming a first photoresist layer on the side, facing the first signal driving lines 111, of the base substrate 100, and forming a second photoresist layer on the side, facing away from the first signal driving lines 111, of the base substrate 100, wherein the first photoresist layer has a plurality of third via holes 143 and a plurality of fourth via holes 144, and the second photoresist layer has a plurality of fifth via holes and a plurality of sixth via holes; and an orthographic projection of one of the third via holes 143 on the base substrate 100 covers an orthographic projection of one of the first via holes 141 on the base substrate 100, an orthographic projection of one of the fourth via holes 144 on the base substrate 100 covers a orthographic projection of one of the second via holes 142 on the base substrate 100, an orthographic projection of one of the fifth via holes on the base substrate 100 covers an orthographic projection of one of the first via holes 141 on the base substrate 100, and an orthographic projection of one of the sixth via holes on the base substrate 100 covers an orthographic projection of one of the second via holes 142 on the base substrate 100;

(8) filling each of the first via holes 141, each of the second via holes 142, each of the third via holes 143, each of the fourth via holes 144, each of the fifth via holes and each of the sixth via holes with the conductive material by one of sputtering process, atomic layer deposition process, evaporation process, electron beam evaporation process and electrochemical deposition process; and (9) removing the first photoresist layer and the second photoresist layer.

Figure 9:
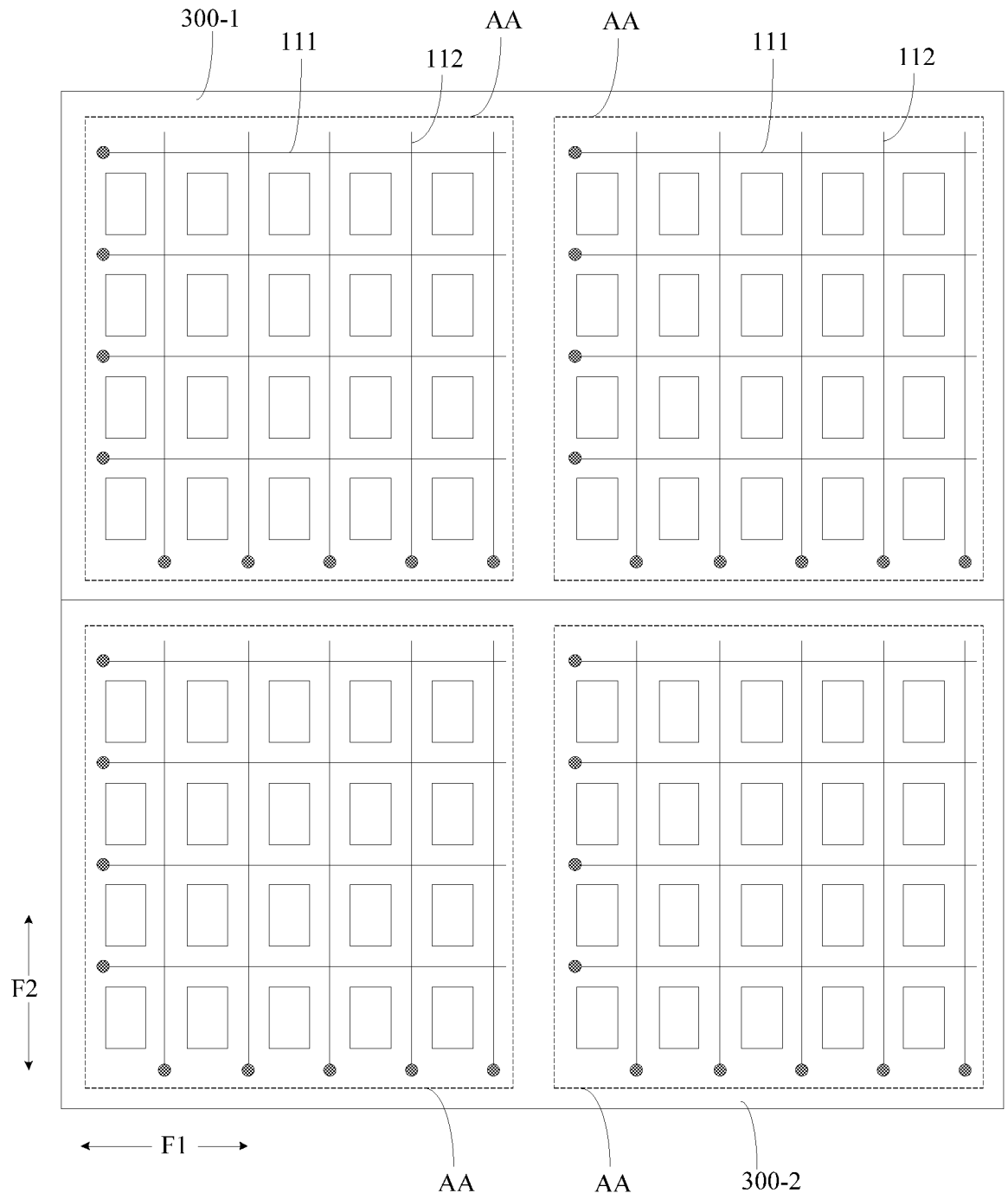
FIG. 9 is a top view of a display panel provided by an embodiment of the disclosure.
Figure 10:
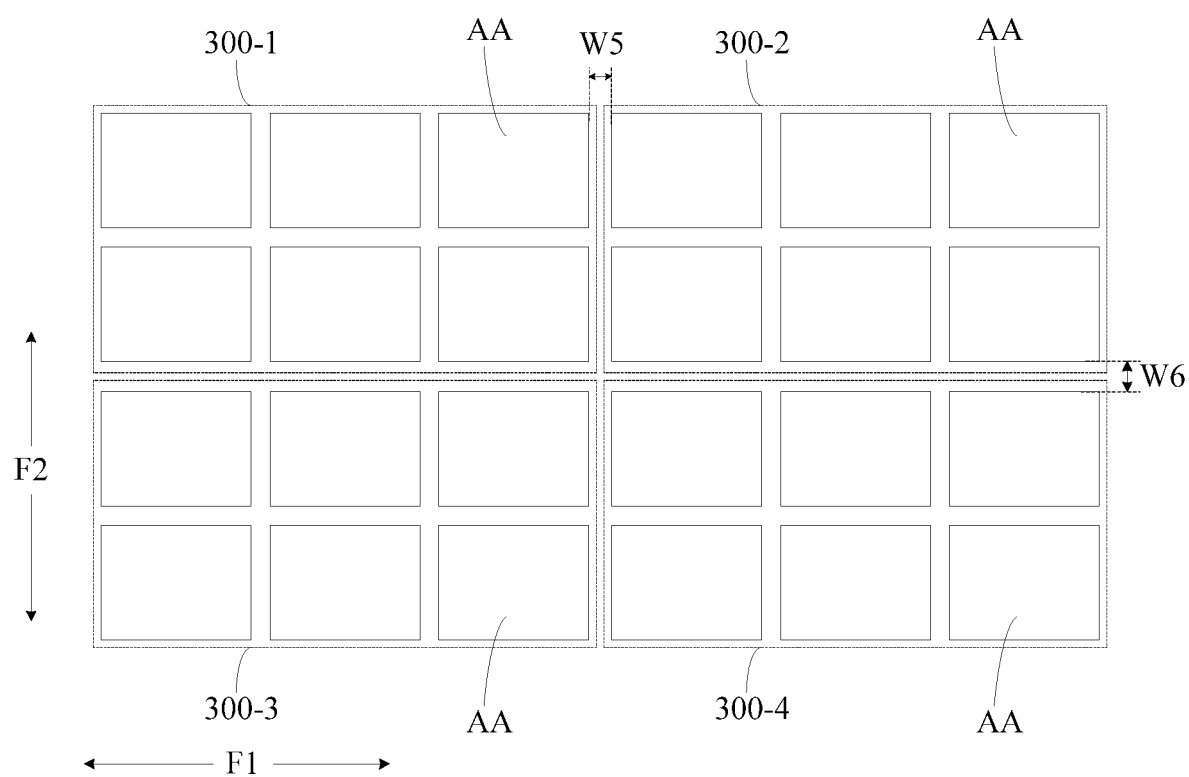
FIG. 10 is a top view of a display panel provided by an embodiment of the disclosure.

Based on the same inventive concept, an embodiment of the disclosure also provides a splicing display panel, as shown in FIG. 9 and FIG. 10, which may include a plurality of the above-mentioned display panels 300-k provided by the embodiments of the disclosure (1≤k≤K, k and K are integers, K is the total number of display panels, FIG. 9 takes K=2 as an example, FIG. 10 takes K=4 as an example);

A space between the nearest display areas AA of the nearest display panels in the row direction F1 has a fifth space size W5. The fifth space size W5 is approximately the same as the first space size W1; and/or a space between the nearest display areas AA of the nearest display panel in the column direction F2 has a sixth space size W6. The sixth space size W6 is approximately the same as the second space size W2. It should be noted that the first space size W1 and the second space size W2 may be understood by referring to the above description of the first space size W1 and the second space size W2, which will not be repeated here.

According to the splicing display panel provided by the embodiments of the disclosure, a plurality of display panels provided with the plurality of display areas can be spliced to produce a larger splicing display panel. In this way, compared with using independent display areas for multiple times of splicing, the number of splicing seams can be greatly reduced, thus reducing the problem that splicing seams are visible and low reliability caused by splicing seams.

Exemplarily, in the preparation process, when the display panel is over 110 inches, one of the above-mentioned display panels with the plurality of display areas can be used as a splicing unit, so as to produce a larger display panel by splicing the display panels. In this way, compared with using independent display areas AA for multiple times of splicing, the number of splicing seams can be greatly reduced, thus reducing the problem that splicing seams are visible and low reliability caused by splicing seams.

Exemplarily, as shown in FIG. 9, two of the above-mentioned display panels can be spliced to form a splicing display panel. For example, the display panels 300-1 and 300-2 are spliced to form a splicing display panel, and each of the display panel 300-1 and the display panel 300-2 includes two adjacent display areas AA. That is, the display panel 300-1 includes two display areas AA, and the display panel 300-2 includes two display areas AA.

Exemplarily, as shown in FIG. 10, four of the above-mentioned display panels can be spliced to form a splicing display panel. For example, the display panels 300-1 to 300-4 are used to form a splicing display panel. Each of the display panels 300-1 to 300-4 may include six adjacent display areas AA. Furthermore, the display areas AA in the display panel 300-1 share one base substrate 100, the display areas AA in the display panel 300-2 share one base substrate 100, the display areas AA in the display panel 300-3 share one base substrate 100, and the display areas AA in the display panel 300-4 share one base substrate 100. Of course, more display panels can be spliced to form a splicing display panel, which is not limited here.

When the above display panels provided by the disclosure are used for splicing, in specific implementation, in some embodiments of the disclosure, as shown in FIG. 10, a space between the nearest display areas AA in adjacent display panels in the row direction F1 has a fifth space size W5. The fifth space size W5 can be made approximately the same as the first space size W1. In this way, by making the fifth space size W5 approximately the same as the first space size W1, the space between the nearest display areas AA in adjacent panel groups in the row direction F1 can be made approximately the same as the space between two adjacent columns of pixel units PX in the display area AA in the row direction F1, that is, the space between two adjacent display areas AA of the same base substrate 100 and the space between pixel units PX can be made approximately the same, thereby further reducing the visibility problem of splicing seams.

It should be noted that, in actual process, due to the limitation of process conditions or other factors, the fifth space size W5 and the first space size W1 are not completely the same, and there may be some differences. In specific implementation, when the ratio of the fifth space size W5 to the first space size $$W1\frac{W5}{W1}$$

meets $$0.6 \le \frac{W5}{W1} \le 1.4,$$

it can be said that the fifth space size W5 and the first space size W1 are the same. For example, in practical applications, if W1=500 μm, when W5 is between 300 μm and 700 μm, it can be said that the fifth space size W5 is the same as the first space size W1.

Due to the limitation of the identifying ability of human eyes, the space between the display areas may not be noticed when it is within a certain range. Therefore, the ratio of the fifth space size W5 to the first space size $$W1\frac{W5}{W1}$$

can also be set according to a critical value of the space between the display areas that human eyes can identify.

Of course, the ratio of the fifth space size W5 to the first space size $$W1\frac{W5}{W1}$$

can also be set according to the combination of the above two methods, so as to satisfy the condition that the fifth space W5 size is approximately the same as the first space size W1. All of these fall within the protection scope of the disclosure.

When panel groups are used for splicing, in specific implementation, in some embodiments of the disclosure, as shown in FIG. 10, a space between the nearest display areas AA in adjacent panel groups in the column direction F2 has a sixth space size W6. The sixth space size W6 can be made approximately the same as the second space size W2. In this way, by making the sixth space size W6 approximately the same as the second space size W2, the space between the nearest display areas AA in adjacent panel groups in the column direction F2 can be made approximately the same as the space between two adjacent rows of pixel units PX in the display area AA in the column direction F2, that is, the space between two adjacent display areas AA of the same base substrate 100 and the space between pixel units PX can be made approximately the same, thereby further reducing the visibility problem of splicing seams.

It should be noted that, in actual process, due to the limitation of process conditions or other factors, the sixth space size W6 and the second space size W2 are not completely the same, and there may be some differences. In specific implementation, when the ratio of the sixth space size W6 to the second space size $$W2\frac{W6}{W2}$$

meets $$0.6 \le \frac{W6}{W2} \le 1.4,$$

it can be said that the sixth space size W6 and the second space size W2 are the same. For example, in practical applications, if W2=500 μm, when W6 is between 300 μm and 700 μm, it can be said that the sixth space size W6 is the same as the second space size W2.

Due to the limitation of the identifying ability of human eyes, the space between the display areas may not be noticed when it is within a certain range. Therefore, the ratio of the sixth space size W6 to the second space size $$W2\frac{W6}{W2}$$

can also be set according to a critical value of the space between the display areas that human eyes can identify.

Of course, the ratio of the sixth space size W6 to the second space size $$W2\frac{W6}{W2}$$

can also be set according to the combination of the above two methods, so as to satisfy the condition that the sixth space size W6 is approximately the same as the second space size W2. All of these fall within the protection scope of the disclosure.

At least one of the display panel and the splicing display panel provided by the embodiments of the disclosure can be applied to a large display device. In specific implementation, in some embodiments of the disclosure, the display device can be any product or component with a display function, such as a display. Other essential components of the display device should be understood by those of ordinary skilled in the art, and are not described in detail herein, nor should they be taken as limitations to the disclosure.

According to the display panel, the splicing display panel and the method for preparing the display panel provided by the embodiments of the disclosure, the plurality of display areas are arranged on one base substrate, and each of the display areas is provided with the plurality of light-emitting chips, so that when the display panel is prepared, the plurality of display areas can be formed after the light-emitting chips are manufactured on one base substrate. In this way, the third space size can be approximately the same as the first space size and/or the fourth space size can be approximately the same as the second space size, so that the display areas can be transitioned uniformly from one to another, thereby solving the problem of large splicing seams caused by the low splicing accuracy of the splicing process and improving the display effect. In addition, since a plurality of display areas for splicing can be formed by using one base substrate, the traditional approach that a plurality of independent display areas are prepared first and then spliced into a display panel can be replaced, which means a large display panel can be formed without the splicing process, so that the production efficiency is improved.

Although the preferred embodiments of the disclosure have been described, those skilled in the art can make additional changes and modifications to these embodiments once they know the basic inventive concepts. Therefore, the appended claims are intended to be interpreted as including the preferred embodiments and all changes and modifications that fall within the scope of the disclosure.

Obviously, those skilled in the art can make various changes and modifications to the embodiments of the disclosure without departing from the spirit and scope of the embodiments of the disclosure. Thus, the disclosure is also intended to include such modifications and variations if they fall within the scope of the claims of the disclosure and their equivalents.

What is claimed is:

1. A display panel, comprising:
a base substrate; and
a plurality of display areas arranged on the base substrate in an array;
wherein,
each of the plurality of display areas comprises a plurality of pixel units;
each of the plurality of pixel units comprises a plurality of sub-pixels; and
each of the plurality of sub-pixels comprises a light-emitting chip;
wherein in any one of the plurality of display areas,
a space between two adjacent columns of pixel units in a row direction has a first space size; and
a space between two adjacent rows of pixel units in a column direction has a second space size;
wherein,
a space between two nearest columns of display areas among the plurality of display areas in the array in the row direction has a third space size, and the third space size is approximately same as the first space size; and/or
a space between two nearest rows of display areas among the plurality of display areas in the array in the column direction has a fourth space size, and the fourth space size is approximately same as the second space size.

2. The display panel according to claim 1, wherein,
sub-pixels in the each of the plurality of display areas are arranged in an array; and
the each of the plurality of the sub-pixels further comprises a driving circuit configured to drive the light-emitting chip.

3. The display panel according to claim 2, wherein the each of the plurality of display areas further comprises:

a plurality of first signal driving lines and a plurality of second signal driving lines located between the base substrate and light-emitting chips of sub-pixels in the display area;
wherein the first signal driving lines and the second signal driving lines are crossed and insulated; and
driving circuits in each row of sub-pixels in the display area are electrically connected to a respective one of the first signal driving lines, and driving circuits in each column of sub-pixels in the display area are electrically connected to a respective one of the second signal driving lines.

4. The display panel according to claim 3, wherein the each of the plurality of display areas further comprises:
a plurality of first signal transmission lines;
a plurality of second signal transmission lines; and
a driving chip electrically connected to the first signal transmission lines and the second signal transmission lines;
wherein the plurality of first signal transmission lines, the plurality of second signal transmission lines and the driving chip are located on a side, facing away from the light-emitting chips, of the base substrate; and
each of the first signal driving lines is electrically connected to a respective one of the first signal transmission lines through a corresponding first via hole penetrating through the base substrate; and each of the second signal driving lines is electrically connected to a respective one of the second signal transmission lines through a corresponding second via hole penetrating through the base substrate.

5. The display panel according to claim 4, wherein each of the first signal driving lines corresponds to a respective one of first via holes; and the first via holes are located at a same end of the first signal driving lines.

6. The display panel according to claim 4, wherein each of the first signal driving lines corresponds to a respective one of first via holes; a part of the first via holes are located at one end of the first signal driving lines, and a rest part of the first via holes are located at another end of the first signal driving lines.

7. The display panel according to claim 6, wherein first via holes corresponding to odd-numbered rows of first signal driving lines are located at the one end of the first signal driving lines, and first via holes corresponding to even-numbered rows of first signal driving lines are located at the another end of the first signal driving lines.

8. The display panel according to claim 4, wherein each of the first signal driving lines corresponds to respective two of first via holes; one of the two first via holes is located at one end of the first signal driving line, and another one of the two first via holes is located at another end of the first signal driving line.

9. The display panel according to claim 4, wherein each of the second signal driving lines corresponds to a respective one of second via holes; and the second via holes are located at a same end of the second signal driving lines.

10. The display panel according to claim 4, wherein each of the second signal driving lines corresponds to a respective one of the second via holes; a part of the second via holes are located at one end of the second signal driving lines, and a rest part of the second via holes are located at another end of the second signal driving lines.

11. The display panel according to claim 10, wherein second via holes corresponding to odd-numbered columns of second signal driving lines are located at the one end of the second signal driving lines, and second via holes corresponding to even-numbered columns of second signal driving lines are located at the another end of the second signal driving lines.

12. The display panel according to claim 4, wherein each of the second signal driving lines corresponds to respective two of second via holes; one of the two second via holes is located at one end of the second signal driving line, and another one of the two second via holes is located at another end of the second signal driving line.

13. A method for preparing the display panel according to claim 1, comprising:
forming the plurality of display areas on the base substrate;
wherein,
each of the plurality of display areas comprises a plurality of pixel units;
each of the plurality of pixel units comprises a plurality of sub-pixels; and
each of the plurality of sub-pixels comprises a light-emitting chip;
wherein in any one of the plurality of display areas,
a space between two adjacent columns of pixel units in a row direction has a first space size; and
a space between two adjacent rows of pixel units in a column direction has a second space size;
wherein,
a space between two nearest display areas among the plurality of display areas in the row direction has a third space size, and the third space size is approximately same as the first space size;
and/or
a space between two nearest display areas among the plurality of display in the column direction has a fourth space size, and the fourth space size is approximately the same as the second space size.

14. The method according to claim 13, wherein said forming the plurality of display areas comprises:
in each of the plurality of display areas on the base substrate:
forming a plurality of first signal driving lines and a plurality of second signal driving lines, wherein the first signal driving lines and the second signal driving lines are crossed and insulated;
forming a plurality of first signal transmission lines and a plurality of second signal transmission lines on a side, facing away from the first signal driving lines, of the base substrate;
forming a plurality of first via holes and a plurality of second via holes; and
forming a conductive material in each of the first via holes and each of the second via holes, so that each of the first signal driving lines is electrically connected to a respective one of the first signal transmission lines through a corresponding first via hole, and each of the second signal driving lines is electrically connected to a respective one of the second signal transmission lines through a corresponding second via hole.

15. The method according to claim 14, wherein said forming the conductive material in each of the first via holes and each of the second via holes comprises:
forming a first photoresist layer on a side, facing the first signal driving lines, of the base substrate; and forming a second photoresist layer on the side, facing away from the first signal driving lines, of the base substrate;
wherein the first photoresist layer has a plurality of third via holes and a plurality of fourth via holes, and the second photoresist layer has a plurality of fifth via holes and a plurality of sixth via holes; and an orthographic projection of each of the third via holes on the base substrate covers an orthographic projection of a respective one of the first via holes on the base substrate, an orthographic projection of each of the fourth via holes on the base substrate covers an orthographic projection of a respective one of the second via holes on the base substrate, an orthographic projection of each of the fifth via holes on the base substrate covers an orthographic projection of a respective one of the first via holes on the base substrate, and an orthographic projection of each of the sixth via holes on the base substrate covers an orthographic projection of a respective one of the second via holes on the base substrate; and
filling each of the first via holes, each of the second via holes, each of the third via holes, each of the fourth via holes, each of the fifth via holes and each of the sixth via holes with the conductive material by one of sputtering process, atomic layer deposition process, evaporation process, electron beam evaporation process and electrochemical deposition process.

16. The method according to claim 15, wherein after said filling each of the first via holes, each of the second via holes, each of the third via holes, each of the fourth via holes, each of the fifth via holes and each of the sixth via holes with the conductive material, the method further comprises:
removing the first photoresist layer and the second photoresist layer.

17. A splicing display panel, comprising a plurality of display panels according to claim 1;
wherein a space between two adjacent display areas, respectively in two nearest display panels among the plurality of display panels, in the row direction has a fifth space size, and the fifth space size is approximately same as the first space size; and/or
a space between two adjacent display areas, respectively in two nearest display panels among the plurality of display panels, in the column direction has a sixth space size, and the sixth space size is approximately same as the second space size.

18. The display panel according to claim 2, further comprising:
a transistor array layer between the light-emitting chip and the base substrate;
wherein the driving circuit comprises:
a switching transistor;
a driving transistor; and
a storage capacitor; and
the transistor array layer is for forming film layers of the switching transistor and the driving transistor and film layers of the storage capacitor.

19. The display panel according to claim 18, wherein the transistor array layer comprises:
an active layer on a side of the base substrate;
a gate layer on a side, facing away from the base substrate, of the active layer;
a capacitor electrode layer on a side, facing away from the base substrate, of the gate layer; and
a source-drain electrode layer on a side, facing away from the base substrate, of the capacitor electrode layer.

* * * * *